United States Patent
Kim et al.

(10) Patent No.: US 10,529,936 B2
(45) Date of Patent: Jan. 7, 2020

(54) MEMORY DEVICE HAVING HYBRID INSULATING LAYER AND METHOD FOR PREPARING SAME

(71) Applicant: KYUNGPOOK NATIONAL UNIVERSITY INDUSTRY-ACADEMIC COOPERATION FOUNDATION, Buk-gu Daegu (KR)

(72) Inventors: Youngkyoo Kim, Suseong-gu Daegu (KR); Hawjeong Kim, Suseong-gu Daegu (KR); Chulyeon Lee, Suseong-gu Daegu (KR)

(73) Assignee: KYUNGPOOK NATIONAL UNIVERSITY INDUSTRY-ACADEMIC COOPERATION FOUNDATION, Daegu (KR)

( * ) Notice: Subject to any disclaimer, the term of this patent is extended or adjusted under 35 U.S.C. 154(b) by 127 days.

(21) Appl. No.: 15/568,312

(22) PCT Filed: Apr. 18, 2016

(86) PCT No.: PCT/KR2016/003992
§ 371 (c)(1),
(2) Date: Jan. 23, 2018

(87) PCT Pub. No.: WO2016/171437
PCT Pub. Date: Oct. 27, 2016

(65) Prior Publication Data
US 2018/0301645 A1    Oct. 18, 2018

(30) Foreign Application Priority Data
Apr. 20, 2015    (KR) .................. 10-2015-0055033

(51) Int. Cl.
*H01L 51/05* (2006.01)
*H01L 51/00* (2006.01)

(52) U.S. Cl.
CPC .......... *H01L 51/0537* (2013.01); *H01L 51/00* (2013.01); *H01L 51/004* (2013.01); *H01L 51/0094* (2013.01); *H01L 51/05* (2013.01)

(58) Field of Classification Search
CPC ...................... H01L 51/004; H01L 51/0537
See application file for complete search history.

(56) References Cited

U.S. PATENT DOCUMENTS

2011/0309415 A1* 12/2011 Ng .................. G01L 1/005
257/254
2018/0327530 A1* 11/2018 Wakita ............... H01B 1/22

FOREIGN PATENT DOCUMENTS

| JP | 2006179776 A | 7/2006 |
| JP | 2008147410 A | 6/2008 |
| JP | 2008171861 A | 7/2008 |

OTHER PUBLICATIONS

Yoon, S. M. et al., Oxide semiconductor-based organic/inorganic hybrid dual-gate nonvolatile memory thin-film transistor. IEEE Trans. Electron Devices, 58 (2011) 2135-2141 (Year: 2011).*
(Continued)

*Primary Examiner* — Robert T Huber
*Assistant Examiner* — Gardner W. S. Swan
(74) *Attorney, Agent, or Firm* — Porzio Bromberg & Newman P.C.

(57) ABSTRACT

The present disclosure relates to a memory device having a hybrid insulating layer and a method for preparing the same. In detail, a memory device including a gate electrode on a substrate, a source electrode, and a drain electrode has a hybrid memory insulating layer between the gate electrode and the source and drain electrodes that is polarizable and includes a mixed material of vinyltriethoxysilane and
(Continued)

organic matter to lead to hysteresis. According to the present disclosure, a memory insulating layer is formed as a hybrid insulating layer including a mixture of polyvinylphenol as the organic matter and vinyltriethoxysilane to complement the properties of an organic memory whereby increasing memory performance, and it stably operates at both low and high temperatures whereby having a wide usage range.

10 Claims, 5 Drawing Sheets

(56) References Cited

OTHER PUBLICATIONS

Noh, S. H. et al., ZnO-based nonvolatile memory thin-film transistors with polymer dielectric/ferroelectric double gate insulators, Appl. Phys. Lett., 90 (2007) 253504 (Year: 2007).*

* cited by examiner

MEMORY DEVICE HAVING HYBRID INSULATING LAYER AND METHOD FOR PREPARING SAME

TECHNICAL FIELD

The present disclosure relates to a memory device having a hybrid insulating layer and a method for preparing the same. In detail, the present disclosure relates to a memory device having a hybrid insulating layer and a method for preparing the same that is capable of improving a memory performance by complementing properties of organic and inorganic matters via a hybrid insulating layer including a mixed material of organic and inorganic matters, stably operating at both high and low temperature conditions, and having the structure of a transistor and performing functions of non-volatile memory by the hysterisis properties of a hybrid insulating layer.

BACKGROUND ART

With the rapid development of information and communication industry and portable information devices, demands for large capacity non-volatile memory devices are increasing. Flash memories based on silicon materials are in the mainstream of these non-volatile memory devices, but technical limitations of flash memories of related art have been revealed in that there is a limitation on the number of data recordation/erasures, data recording speed is low, it is hard to implement high integration and miniaturization. Therefore, studies on various types' next-generation non-volatile memory devices have been conducted.

For example, the development of technology for overcoming physical limitations of the silicon memory device of related art, by using organic matters as materials for a memory layer of memory device, and for implementing a next-generation non-volatile memory device characterized by ultra-high speed, high capacity, low consumption power, and low cost, is actively conducted.

As the organic memory device, Korean Registered Patent Nos. 1190570 and 1214225 disclose technique of an organic memory device that has a proper permittivity and includes an insulating layer and including polyvinylalcohol functioning as a memory.

According to the references, the structure of the organic memory device has a tunneling organic insulating layer including at least one of polymethyl methacrylate, polyvinyl phenol, and polyvinyl alcohol between a gate electrode layer and a source-and-drain electrode layer.

In the case of the organic memory device having an organic insulating layer, there is the advantage that charge mobility is higher; whereas there are disadvantages: leakage current is generated, it is difficult to drive at high temperature due to low glass transition temperature of below 85° C. and it is possible to drive at low temperature only.

Accordingly, there is an increasing demand for a memory device and a method for preparing the same capable of overcoming inconvenient features of an organic memory device having an organic insulating layer and capable of stable driving at low and high temperatures.

DISCLOSURE OF INVENTION

The present disclosure is introduced to resolve the above problems and to provide an organic memory device and a method for preparing the same having a hybrid insulating layer that: includes a mixed material of vinyltriethoxysilane and organic matter between a gate electrode and a charge transport layer by complementing properties of an organic memory so that a memory performance is increased and the memory device is stably operated both at high and low temperature conditions. The hybrid insulating layer is polarizable leading to a hysteresis characteristic in the drain current enabling the transistor structure to function as a memory structure.

According to an example of the present disclosure, in a transistor including a gate electrode: formed on a substrate, a source electrode, and a drain electrode, there is a hybrid memory insulating layer being polarizable and including a mixed material of vinyltriethoxysilane and organic matter to likely lead to hysteresis between the gate electrode and the source and drain electrodes.

Here, the organic matter of the hybrid memory insulating layer includes polyvinylphenol.

In addition, the hybrid memory insulating layer includes vinyltriethoxysilane.

In addition, a memory device having a hybrid insulating layer includes a substrate; a gate electrode formed on the substrate; a hybrid memory insulating layer being formed in the gate electrode, which is polarizable and includes a mixed material of vinyltriethoxysilane and organic matter to lead to hysteresis; a charge transport layer formed on the hybrid memory insulating layer; and a source electrode and a drain electrode formed to be separated by a specific distance on the charge transport layer.

Here, the hybrid memory insulating layer comprises polyvinylphenol, and vinyltriethoxysilane.

In addition, the charge transport layer is a hole transport layer.

A method for preparing a memory device having a hybrid insulating layer according to an example of the present disclosure, includes: forming a gate electrode on a substrate; forming a hybrid memory insulating layer formed on the gate electrode, that is polarizable, which may lead to hysteresis, and includes a mixed material of vinyltriethoxysilane and organic matter; forming a hybrid memory insulating layer that is polarizable; forming a charge transport layer on the hybrid memory insulating layer; and forming a source electrode and a drain source to be separated by a specific distance on the charge transport layer.

In the preparation method, the hybrid memory insulating layer comprises polyvinylphenol, and vinyltriethoxysilane.

In addition, the forming of hybrid memory insulating layer comprises reacting polyvinylphenol and vinyltriethoxysilane by adding water and acetic acid as catalyst for a specific hour to form a chemical bond.

In addition, crosslinking is performed by bonding between hydroxyl group of polyvinylphenol and hydroxyl group of vinyltriethoxysilane.

In addition, the hybrid memory insulating layer is formed by sol-gel process.

According to the present disclosure, a memory insulating layer is formed as a hybrid insulating layer including a mixture of polyvinylphenol as the organic matter and vinyltriethoxysilane whereby increasing memory performance, and it may be stably operated at low temperature and high temperature, which makes it possible to be used widely.

In addition, the present disclosure enables an insulating layer to have a superior drain current at a low voltage by reducing permittivity and having rarely hysteresis loss due to a chemical bonding via crosslinking between polyvinylphenol as organic matter and vinyltriethoxysilane, and thus, the present disclosure is operable at a low voltage.

In addition, the insulating layer is firm by a chemical bonding of polyvinylphenol and vinyltriethoxysilane which is a silicon-based matter, so the insulating layer itself may he used as a substrate, and thus, no additional substrate manufacturing step is required. Therefore, there is an effect of reducing time and cost for a manufacturing process.

BEST MODE FOR CARRYING OUT THE INVENTION

The following detailed description is provided to assist the reader in gaining a comprehensive understanding of the methods, apparatuses, anchor systems described herein. However, various changes, modifications, and equivalents of the methods, apparatuses, and/or systems described herein will he apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Figure 1:
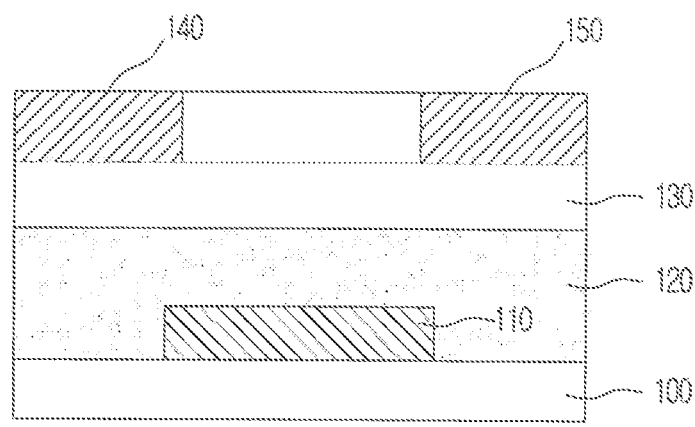
FIG. 1 is a cross-section of memory device having a hybrid insulating layer according to an example of the present disclosure.
Figure 2:
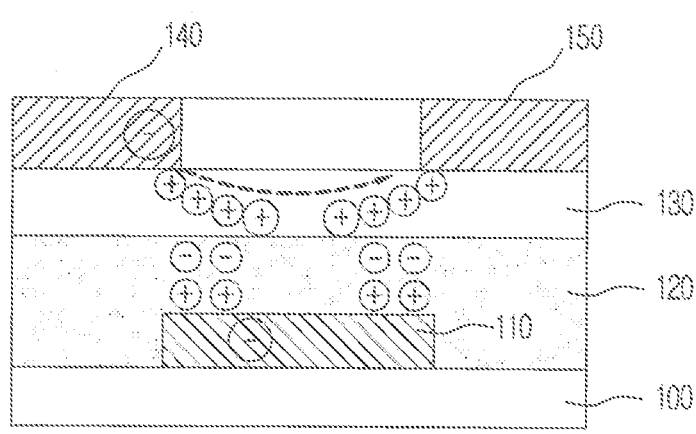
FIG. 2 is a cross-section showing how a memory device having a hybrid insulation layer according to an example, of the present disclosure operates.

FIG. 1 is a cross-section of memory device having a hybrid insulating layer according to an example of the present disclosure, and FIG. 2 is a cross-section showing how a memory device having a hybrid insulation layer according to an example of the present disclosure operates.

Referring to the figures, a memory device having a hybrid insulating layer according to the present disclosure may include a substrate 100, a gate electrode 110 formed on the substrate 100, a hybrid. memory insulating layer 120 including a mixed material of vinyltriethoxysilane and organic matter, a charge transport layer 130, a source electrode 140, and a drain electrode 150.

First, the present disclosure uses the feature that the insulating layer 120 located between the gate electrode 110 and the charge transport layer 130 may function as a memory when it comprises a polarizable material which may lead to hysteresis. A memory device using hysteresis property is technique a using hysteresis curve where a change curve of current when increasing a voltage and a change curve of current when decreasing a voltage are different from each other and using each quadrants of hysteresis curve as storing means (00, 01, 10, 11).

In addition, the present disclosure may improve memory performance by mixing vinyltriethoxysilane and organic matter to complement a property of organic memory devices.

First, regarding the substrate 100, silicon substrate, glass substrate, plastic substrate, and so on may be used.

The gate electrode 110 may be formed using conductive matters, for example, Au, Ag, Ni/Al, polymer, and so on.

Regarding the hybrid memory insulating layer 120, chemical bond may be formed by mixing Polyvinyl Alcohol (PVP), which is organic matter, and Vinyltriethoxysilane (VTES), which is matter based on silicon.

The hybrid memory insulating layer 120 formed with a mixture of vinyltriethoxysilane and organic matter has a hysteresis characteristic and permittivity is approximately 5~10 $\varepsilon$.

In related art, ferroelectric substances such as polyvinyledenedffluoridetetrafluoroethy (PVDF-TrFE), and so on are used as a memory insulating layer, using hysteresis characteristic, but those ferroelectric substances have the permittivity of approximately 16 $\varepsilon$ and have shortcomings: current is not turned into off-state and the current is leaked to result in crosstalk; and they have low durability because an insulating layer is formed only using organic matter; and they are very weak at high temperatures. The hybrid memory insulating layer 120 of the present disclosure has low permittivity, so crosstalk will not occur and the present disclosure even overate at a low voltage.

The source electrode 140 and drain electrode 150 are formed to be separated by a specific distance on the charge transport layer 130, and they may be composed of conductive materials such as Au, Ag, Cu, Ni/Al, polymer, and so on.

The operation principle is described referring to FIG. 2. If a voltage is applied to the gate electrode 110, the hybrid memory insulating layer 120 is electrically polarized, which may lead to hysteresis, whereby a hole hysteresis may occur in the charge transport layer 130.

As hysteresis characteristic results from the hole movement of charge transport layer 130, charge mobility from source electrode 140 to drain electrode 150 gets higher whereby drain current has hysteresis characteristics, and thus, the present disclosure has a transistor structure and also functions as a non-volatile memory.

That is, obvious hysteresis characteristic of drain current means a voltage difference due to hysteresis is large. Therefore, if a hybrid memory insulating layer in which a voltage difference due to hysteresis is large, a threshold voltage of memory device increases, and thus, the transistor according to the present disclosure operates even at a low voltage.

Figure 3:
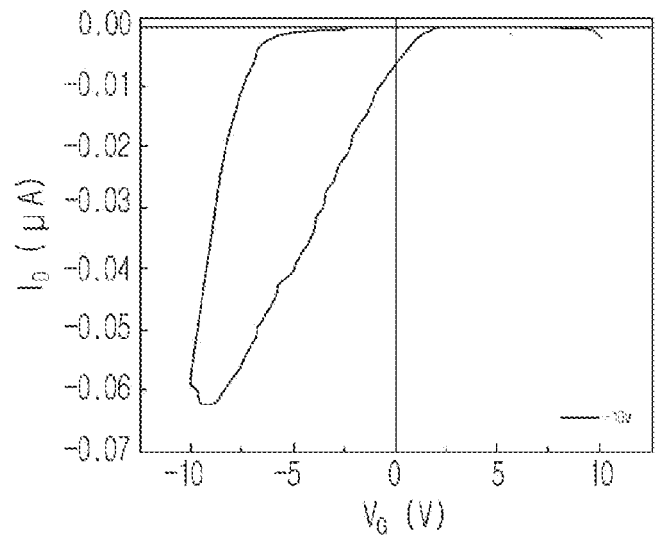
FIGS. 3 and 4 are graphs showing properties of hysteresis of memory device at different temperature conditions.
Figure 4:
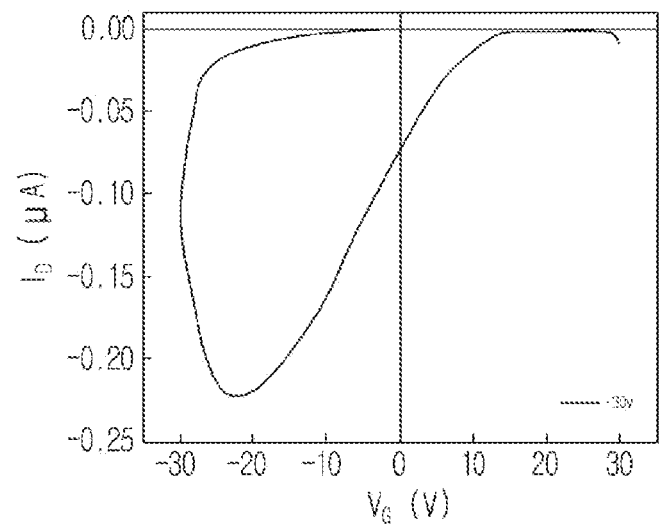

FIGS. 3 and 4 are graphs showing properties of hysteresis of memory device at different temperature conditions. FIG. 3 is a graph showing property of hysteresis at the condition of temperature 50° C., and FIG. 4 is a graph showing property of hysteresis at the condition of temperature 250° C.

Referring to the figures, it is understood that in a memory device having a hybrid insulating layer according to the present disclosure, hysteresis clearly shown at the conditions of temperature 50° C. or high temperature such a 250° C., and there are almost no hysteresis losses.

A memory device having a hybrid insulating layer according to the present disclosure may be stably used at high temperatures via crosslinking of PVP, organic matter, and VTES, matter based on silicon.

Figure 5:
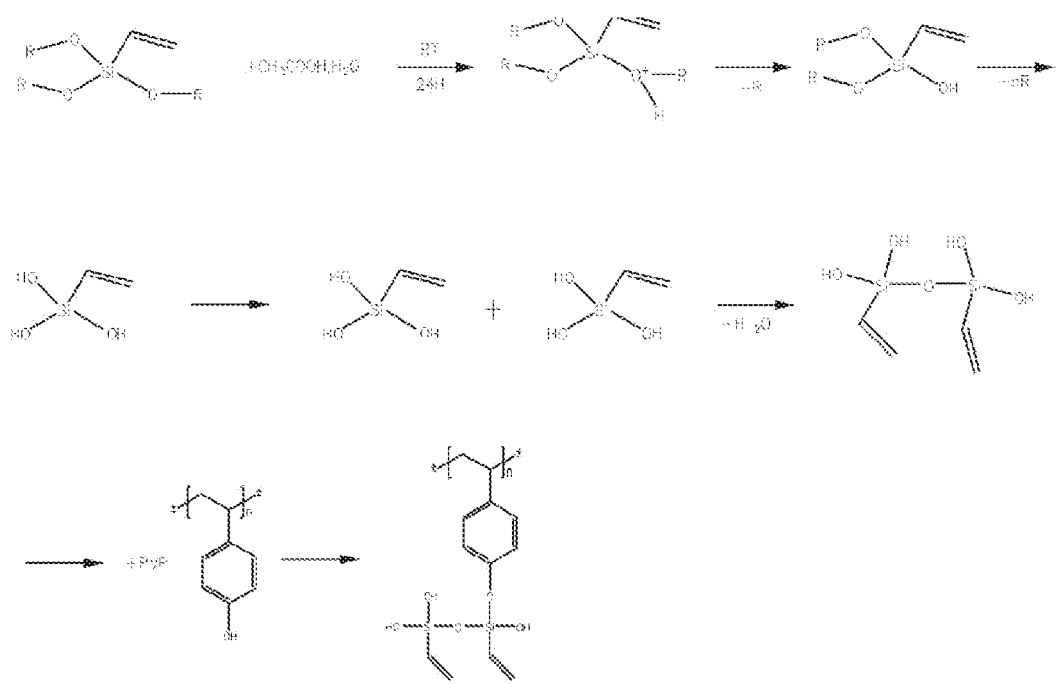
FIG. 5 is a drawing showing a reaction scheme for forming a hybrid memory insulator according to the present disclosure.

FIG. 5 is a drawing showing a reaction scheme for forming a hybrid memory insulator according to the present disclosure. As illustrated in FIG. 5, crosslinking is performed by reacting polyvinylphenol and vinyltriethoxysilane with the addition of water ($H_2O$) and acetic acid ($CH_3COOH$) as a catalyst for approximately one day at room temperature and bonding between hydroxy group (OH) of the polyvinylphenol and hydroxy group (OH) of the vinyltriethoxysilane.

In addition, the hybrid memory insulating layer has advantages because it is produced by sol-gel process: it has a superior thermal stability; a high penetrability is maintained; it has a great penetrability under visible ray; and a high transparency remains in spite of long exposure at high temperature.

FIGS. 6 to 9 are cross-sections showing a process in serial order for producing an organic memory device according to an example of the present disclosure.

Figure 6:
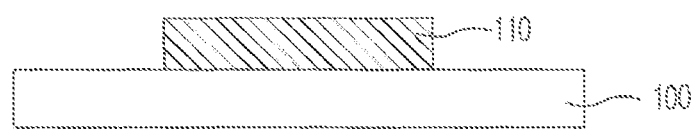
FIGS. 6 to 9 are cross-sections showing sequential process of organic memory preparation method according to an example of the present disclosure.

Referring to FIG. 6, a gate electrode 100 is formed on a substrate 100.

The gate electrode 100 is formed using the technique of patterning after thermal evaporation of conductive material, and the conductive material may be, for example, Au, Ag, Cu, Ni/Al, polymer, and so on.

Figure 7:
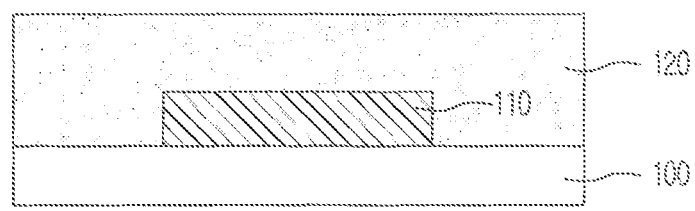

Referring to FIG. 7, a hybrid memory insulating layer 120 is formed with an even thickness on the substrate 100 where the gate electrode is formed.

The hybrid memory insulating layer 120 is produced using a material that is electrically polarized, showing hysteresis and is produced using a mixture of vinyltriethoxysilane and organic matter.

In detail, crosslinking is performed by reacting polyvinylphenol and vinyltriethoxysilane with the addition water ($H_2O$) and acetic acid ($CH_3COOH$) as a catalyst for approximately one day at room temperature and bonding between hydroxy group (OH) of the polyvinylphenol and hydroxy group (OH) of the vinyltriethoxysilane.

The hybrid memory insulating layer 120 formed in that ay, which is a gel, is used to coat the top of the substrate 100 in which the gate electrode 110 is formed. At this time, the coating of a substrate with the mixed gel may be conducted in the way of spin coating, and after the coating, a heat treatment is performed at temperature 80 to 120° C. for 10 to 14 hours to produce the hybrid memory insulating layer 120.

The hybrid memory insulating layer 120 may be produced by sol-gel process.

Figure 8:
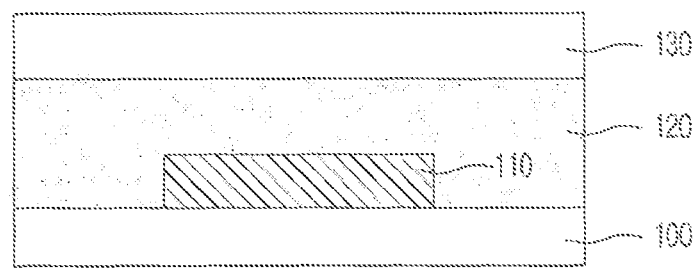

Referring to FIG. 8, a charge transport layer 130 is formed on the hybrid memory insulating layer 120, but in order to form a charge transport layer having high efficiency in charge transportation, for example, P3HT(poly(3-hexylthiophene) is coated on the hybrid memory insulating layer using a method such as the spin coating.

Additionally, the charge transport layer 130 may include a polymer active layer as an organic semiconductor layer.

Figure 9:
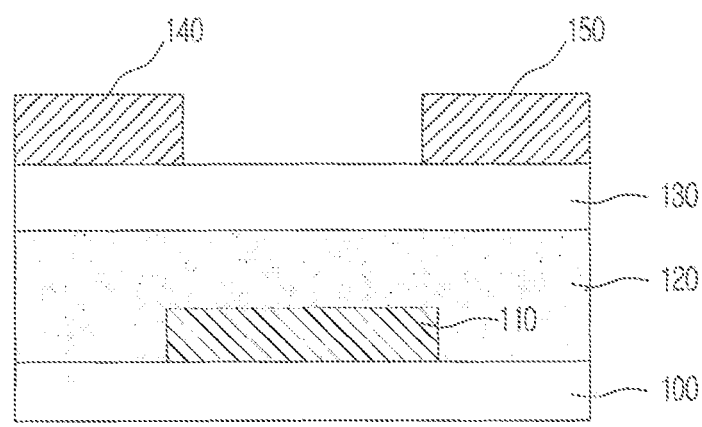

Referring to FIG. 9, in the charge transport layer 130, conductive material, for example, Au, Ag, Cu, Ni/Al, polymer, and so on, are formed, and then a source electrode 140 and a drain electrode 150 are formed with a specific separation via patterning process.

While this disclosure has been described in connection with what is presently, considered to he practical exemplary embodiments, it is to be understood that the disclosure is not limited to the disclosed embodiments, but, on the contrary, is intended to cover various modifications and equivalent arrangements included within the spirit and scope of the appended claims. Accordingly, the scope of the present disclosure shall be determined only according to the attached claims.

The invention claimed is:

1. A memory device having a hybrid memory insulating layer, comprising a gate electrode formed on a substrate, a source electrode, and a drain electrode,
    wherein the hybrid memory insulating layer being polarizable and comprising a mixed material of vinyltriethoxysilane and organic matter to lead to hysteresis, the hybrid memory insulating layer is formed between the gate electrode and the source and drain electrodes.

2. The memory device of claim 1, wherein the organic matter of the hybrid memory insulating layer comprises polyvinylphenol.

3. A memory device comprising:
    a substrate;
    a gate electrode formed on the substrate;
    a hybrid memory insulating layer formed on the gate electrode, the hybrid memory insulating layer being polarizable and comprising a mixed material of vinyltriethoxysilane and organic matter to lead to hysteresis;
    a charge transport layer formed on the hybrid memory insulating layer; and
    a source electrode and a drain electrode formed to be separated by a specific distance on the charge transport layer.

4. The memory device of claim 3, wherein the organic matter of the hybrid memory insulating layer comprises polyvinylphenol.

5. The memory device of claim 3, wherein the charge transport layer is a hole transport layer.

6. A method for preparing a memory device having a hybrid memory insulating layer, comprising:
    forming a gate electrode on a substrate;
    forming on the gate electrode a hybrid memory insulating layer that is polarizable to lead to hysteresis and comprises a mixed material of organic matter and vinyltriethoxysilane;
    forming a charge transport layer on the hybrid memory insulating layer; and
    forming a source electrode and a drain electrode to be separated by a specific distance on the charge transport layer.

7. The method of claim 6, wherein the organic matter of the hybrid memory insulating layer comprises polyvinylphenol.

8. The method of claim 7, wherein the forming of the hybrid memory insulating layer comprises reacting the polyvinylphenol and the vinyltriethoxysilane by adding water and acetic acid as catalyst to form a chemical bond.

9. The method of claim 8, wherein crosslinking is performed by bonding between a hydroxyl group of the polyvinylphenol and a hydroxyl group of the vinyltriethoxysilane.

10. The method of claim 8, wherein the hybrid memory insulating layer is formed by a sol-gel process.

* * * * *